United States Patent [19]

Sato

[11] Patent Number: 5,528,162
[45] Date of Patent: Jun. 18, 1996

[54] SEMICONDUCTOR DEVICE HAVING A TEST MODE SETTING CIRCUIT

[75] Inventor: Toshiya Sato, Tokyo, Japan

[73] Assignee: NEC Corporation, Tokyo, Japan

[21] Appl. No.: 309,473

[22] Filed: Sep. 22, 1994

[30] Foreign Application Priority Data

Sep. 22, 1993 [JP] Japan .................................. 5-259152

[51] Int. Cl.$^6$ ................................. G01R 31/26
[52] U.S. Cl. ....................... 324/765; 324/158.1; 324/763; 371/22.1
[58] Field of Search ................... 324/765, 763, 324/158.1; 371/22.3, 22.6, 22.1, 21.3; 365/201

[56] References Cited

U.S. PATENT DOCUMENTS

| | | | |
|---|---|---|---|
| 4,841,233 | 6/1989 | Yoshida | 365/201 |
| 4,970,727 | 11/1990 | Miyawaki | 371/21.3 |
| 5,023,840 | 6/1991 | Tobita | 365/201 |
| 5,036,272 | 7/1991 | Cho et al. | 371/22.1 |
| 5,220,281 | 6/1993 | Matsoki | 324/158 R |

OTHER PUBLICATIONS

Circuit Diagram of 7475 Chip Radio Shack Engineers Notebook p. 78, 1980.

*Primary Examiner*—Kenneth A. Wieder
*Assistant Examiner*—Kourosh Cyrus Khosra, VI
*Attorney, Agent, or Firm*—Whitham, Curtis, Whitham & McGinn

[57] ABSTRACT

In a semiconductor device having "N" input terminals, a high voltage for a mode switching is applied to a first input terminal, and mode setting information is supplied to the other input terminals. A latch circuit holds the mode setting information supplied during a predetermined period of time starting from application of the high voltage to the first input terminal, during a period of time in which the high voltage continues to be supplied to the first input terminal. Thus, a test is performed on the basis of the mode switching instruction held in the latch circuit and data applied to the other input terminals. On the other hand, if the high voltage is disconnected, the latch circuit is reset.

3 Claims, 4 Drawing Sheets

SEMICONDUCTOR DEVICE HAVING A TEST MODE SETTING CIRCUIT

BACKGROUND OF THE INVENTION

1. Field of the Invention

The present invention relates to a semiconductor device, and more specifically to a setting of an operation mode such as a test mode in the semiconductor device.

2. Description of Related Art

Conventional semiconductor devices have a test mode for testing and verifying an operation of the device itself, in addition to an ordinary operation mode. To enter this test mode, it is necessary to provide a signal such as a mode switching signal from an external device. In addition, it is required that a circuit responding to the external signal to set various sections of the semiconductor device, is provided internally in the semiconductor device.

Generally, when the device is to be put into the test mode, a voltage higher than a power supply voltage is applied to a predetermined terminal, so that the high voltage is detected by a high voltage detection circuit. In response to detection of the high voltage by the high voltage detection circuit, the device is actually put into the test mode. In this case, high voltage detection circuits of the same number as that of the test modes are required. This is a hindrance to reduction of the semiconductor device chip area.

In order to overcome this disadvantage, U.S. Pat. No. 5,036,272 proposes one test mode setting circuit, which is called a "first prior art" hereinafter. The disclosure of U.S. Pat. No. 5,036,272 is incorporated by reference in its entirety into the present application. FIG. 1 shows, in a modified form, the test mode setting circuit disclosed in U.S. Pat. No. 5,036,272.

The shown test mode setting circuit of the first prior art includes a plurality of input buffers $IB_{3-0}, \ldots, IB_{3-4}$, connected to a plurality of input terminals $IN_{3-0}, \ldots, IN_{3-4}$, respectively, and on the basis of input signals supplied to the input buffers, a plurality of output signals $OUT_{3-0}, \ldots, OUT_{3-16}$ are generated.

A high voltage detection circuit $HV_{3-1}$ discriminates whether or not a high voltage is applied to the input terminal $IN_{3-0}$. When the high voltage is applied, the high voltage detection circuit $HV_{3-1}$ generates a high level output signal, which is supplied in common to a plurality of NAND gates $NA_{3-1}, \ldots, NA_{3-16}$, so that these NAND gates $NA_{3-1}, \ldots, NA_{3-16}$ are enabled. Thus, decoded signals outputted from a decoder $DEC_3$, which has an input connected to outputs of the input buffers $IB_{3-1}, \ldots, IB_{3-4}$, are passed through the NAND gates $NA_{3-1}, \ldots, NA_{3-16}$, and outputted through inverters $INV_{3-1}, \ldots, INV_{3-16}$ as the output signals $OUT_{3-1}, \ldots, OUT_{3-16}$, which are used to set different sections of the semiconductor device.

In the shown example, the decoder $DEC_3$ has an input of four bits, and therefore, has 16 outputs corresponding to 16 bits.

Thus, if the high voltage is applied to the input terminal $IN_{3-0}$, the high voltage detection circuit HV3-1 outputs the high level signal, which is supplied to the NAND gates $NA_{3-1}, \ldots, NA_{3-16}$. On the other hand, information supplied to the input terminals $IN_{3-1}, \ldots, IN_{3-4}$ is decoded by the decoder $DEC_3$, and one of the output signals $OUT_{3-1}, \ldots, OUT_{3-16}$, corresponding to a desired test mode setting signal, is brought to a high level. As a result, the device is put in the test mode.

In order to minimize the number of high voltage input terminals and at the same time to be capable of setting an increased number of different test modes, U.S. Pat. No. 4,841,233 proposes one test mode setting circuit, which is called a "second prior art" hereinafter. The disclosure of U.S. Pat. No. 4,841,233 is incorporated by reference in its entirety into the present application. FIGS. 2 and 3 show, in a slightly modified form, the test mode setting circuit disclosed in U.S. Pat. No. 4,841,233.

The circuit shown in FIG. 2 includes input terminals $T_{4-1}$, $T_{4-2}$ and $T_{4-3}$. The input terminal $T_{4-1}$ is connected to an input of an input buffer $IB_{4-1}$ and an output of an output buffer $OB_{4-1}$. The input terminals $T_{4-2}$ and $T_{4-3}$ are connected to an input of input buffers $IB_{4-2}$ and $IB_{4-3}$, respectively.

The input terminal $T_{4-2}$ is also connected to a high voltage detection circuit $HV_{4-1}$, which has a output "A" connected to an control input of latches $LA_{4-1}$ and $LA_{4-2}$. A data input of the latches $LA_{4-1}$ and $LA_{4-2}$ are connected to the input terminals $T_{4-1}$ and $T_{4-3}$, respectively, and a data output of the latches $LA_{4-1}$ and $LA_{4-2}$ and the input buffer $IB_{4-1}$, $IB_{4-2}$ and $IB_{4-3}$ are connected to an internal control circuit $CIR_4$.

Each of the latches $LA_{4-1}$ and $LA_{4-2}$ is constituted of, as shown in FIG. 3, a pair of NAND circuits $NA_{5-1}$ and $NA_{5-2}$ connected to form a latch, and a third NAND circuit $NA_{5-3}$ for bringing the latch in a set condition. If the output "A" of the high voltage detection circuit $HV_{4-1}$ is brought into a logical high level "H", the NAND circuit $NA_{5-3}$ is enabled, and a signal applied to an input terminal $IN_{5-1}$ is held in the latch consisting of the NAND circuits $NA_{5-1}$ and $NA_{5-2}$. Incidentally, a terminal $R_{5-1}$ is a power-on-reset terminal, so that this latch is reset in response to a power-on of an electric supply.

In the above mentioned arrangement, when the high voltage is applied to the terminal $T_{4-2}$, the output "H" of the high voltage detection circuit $HV_{4-1}$ is brought to a logical high level "H". At this time, if the input signal of the high level "H" is applied to each input terminal, the data output of the latches $LA_{4-1}$ and $LA_{4-2}$ are fixed to the high level "H". Thus, the device is put in the test mode.

However, the above mentioned conventional test mode setting circuits are disadvantageous in the following points:

In the test mode setting circuit of the first prior art, in order to enter the test mode, it is necessary not only to supply the high voltage to the input terminal $IN_{3-0}$ for the high voltage input, but also to supply signals to the other input terminals $IN_{3-1}, \ldots, IN_{3-4}$. In ordinary cases, there is no terminal used for only the test mode. In other words, one of the existing terminals is used as the input terminal used for setting the test mode. Accordingly, it is not possible to carry out a test which requires changing the level of the input signals supplied to the input terminals $IN_{3-1}, \ldots, IN_{3-4}$.

In the test mode setting circuit of the second prior art, on the other hand, the above mentioned disadvantage of the first prior art has been solved. However, a test mode setting manner is a problem. For example, if the input signal level of the high voltage detection circuit $HV_{4-1}$ is temporarily inverted or flipped in the ordinary operation due to power supply voltage noise or another adverse influence, there is a possibility that the device is erroneously put in the test mode depending on the condition of the input signals supplied to the input terminals $T_{4-1}$ and $T_{4-3}$. Once the device is put into the test mode, the device cannot resume the ordinary operation condition unless the power supply is shut down. Depending upon the status of the board on which the device is assembled, the device is fixed in the test mode into which the device never enters.

SUMMARY OF THE INVENTION

Accordingly, it is an object of the present invention to provide a semiconductor device which has overcome the above mentioned defects of the conventional ones.

Another object of the present invention is to provide a test mode setting circuit, capable of carrying out the test which requires changing the level of the input signals in the test mode, and which can make the semiconductor device stable so that it is not subjected to an adverse influence such as electric power supply voltage noise.

The above and other objects of the present invention are achieved in accordance with the present invention by a semiconductor device comprising "N" input terminals (where "N" is an integer larger than 1), a mode switching instruction being applied to a first input terminal of the "N" input terminals, and hold means connected to a second input terminal of the "N" input terminals, for holding a mode setting information supplied to the second input terminal during a predetermined period of time starting from application of the mode switching instruction to the first input terminal, during a period of time in which the mode switching instructions continues to be supplied to the first input terminal.

Preferably, the hold means includes a one-shot circuit for generating a pulse during the predetermined period of time starting when the mode switching instruction is applied to the first input terminal, a hold circuit for holding the mode setting information supplied to the second input terminal during the predetermined period of time, so that a test is performed on the basis of the mode switching instruction held in the hold means and data applied to the "N" input terminals.

In one embodiment, the one-shot circuit includes a detection circuit connected to the first input terminal for detecting that the mode switching instruction is applied to a first input terminal, and a pulse generation circuit connected to the detection circuit, for generating, on the basis of a detection result, the pulse having a pulse width corresponding to the predetermined period of time.

In another embodiment, the one-shot circuit includes a detection circuit connected to "M" input terminals (where "M" is an integer larger than 1, but M<N) of the "N" input terminals, for detecting that the mode switching instruction is applied to any one of the "M" input terminals, and a pulse generation circuit connected to the detection circuit, for generating, on the basis of a detection result, the pulse having a pulse width corresponding to the predetermined period of time.

The above and other objects, features and advantages of the present invention will be apparent from the following description of preferred embodiments of the invention with reference to the accompanying drawings.

DESCRIPTION OF THE PREFERRED EMBODIMENTS

Figure 4:
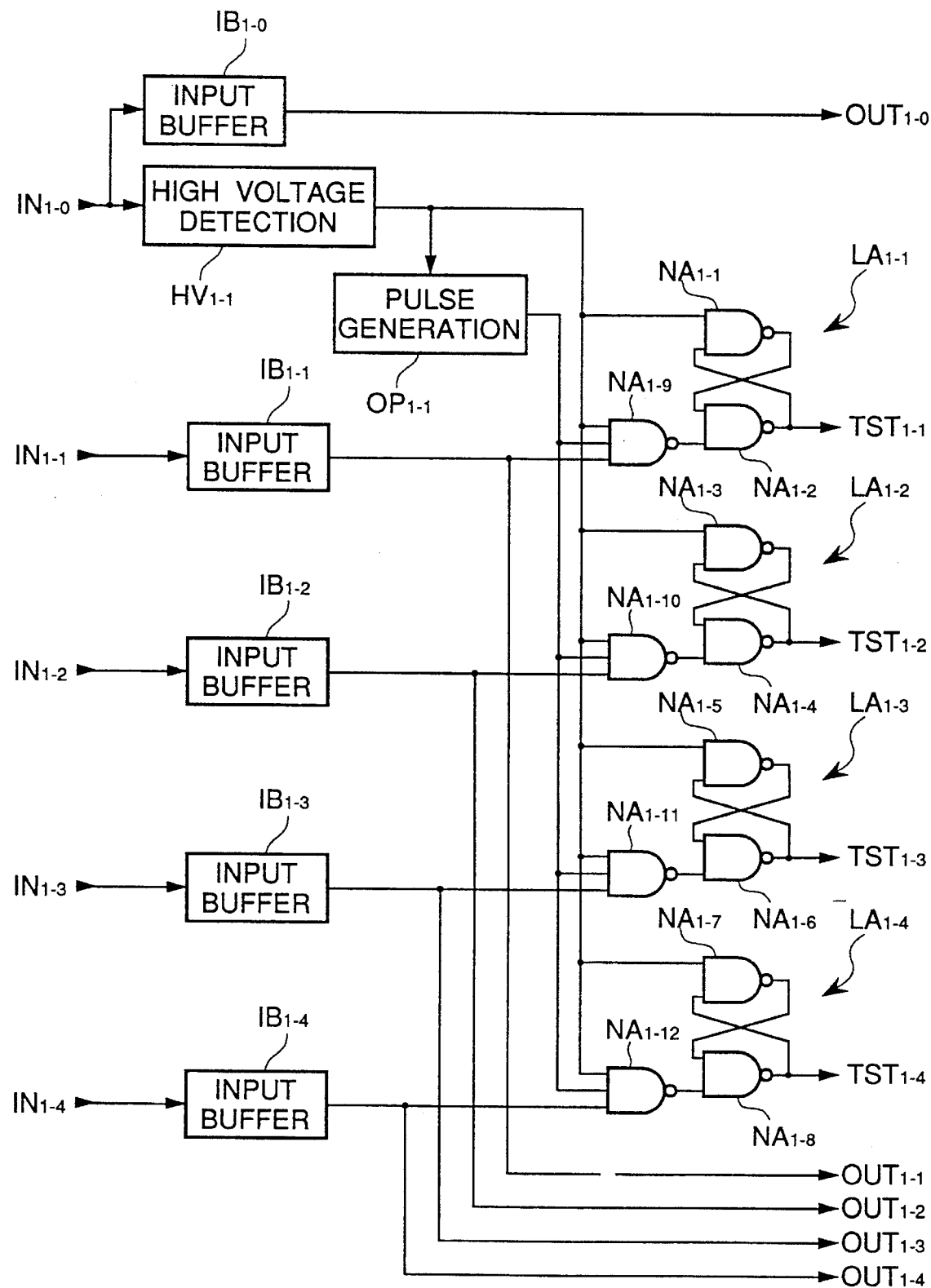
FIG. 4 is a block diagram of a first embodiment of the test mode setting circuit in accordance with the present invention, incorporated in a semiconductor device.

Referring to FIG. 4, there is shown a block diagram of a first embodiment of the test mode setting circuit in accordance with the present invention, incorporated in a semiconductor device.

The shown embodiment of the test mode setting circuit includes a plurality of input terminals $IN_{1-0}, \ldots, IN_{1-4}$ and a corresponding number of input buffers $IB_{1-0}, \ldots, IB_{1-4}$ having an input connected to the input terminals $IN_{1-0}, \ldots, IN_{1-4}$, respectively. Outputs of the input buffers $IB_{1-0}, \ldots, IB_{1-4}$ are outputted as output signals $OUT_{1-0}, \ldots, OUT_{1-4}$, respectively, to an internal circuit (not shown) of the semiconductor device.

The input terminal $IN_{1-0}$ is also connected to a high voltage detection circuit $HV_{1-1}$. When a voltage higher than a power supply voltage is applied to the input terminal $IN_{1-0}$, the high voltage detection circuit $HV_{1-1}$ generates an output signal of a logical high level "H", which is supplied to a pulse generation circuit $OP_{1-1}$. When the output signal of the high voltage detection circuit $HV_{1-1}$ is brought to the logical high level "H", the pulse generation circuit $OP_{1-1}$ generates a pulse having a predetermined pulse width. This pulse generation circuit $OP_{1-1}$ can be formed of a one-shot pulse generator well known to persons skilled in the art.

Furthermore, the outputs of the input buffers $IB_{1-1}, \ldots, IB_{1-4}$ are connected to a first input of three-input NAND circuits $NA_{1-9}, \ldots, NA_{1-12}$, respectively. A second input and a third input of each of the three-input NAND circuits $NA_{1-9}, \ldots, NA_{1-12}$ are connected to receive the output of the pulse generation circuit $OP_{1-1}$ and the output of the high voltage detection circuit $HV_{1-1}$, respectively.

With this arrangement, when both of the output of the pulse generation circuit $OP_{1-1}$ and the outputs of the high voltage detection circuit $HV_{1-1}$ are at the logical high level "H", the output of the input buffers $IB_{1-1}, \ldots, IB_{1-4}$ pass through the NAND circuits $NA_{1-9}, \ldots, NA_{1-12}$, and then, are inputted to one input of latch circuits $LA_{1-1}, LA_{1-2}, LA_{1-3}$ and $LA_{1-4}$, each of which receives at its other input the output of the high voltage detection circuit $HV_{1-1}$.

Figure 1:
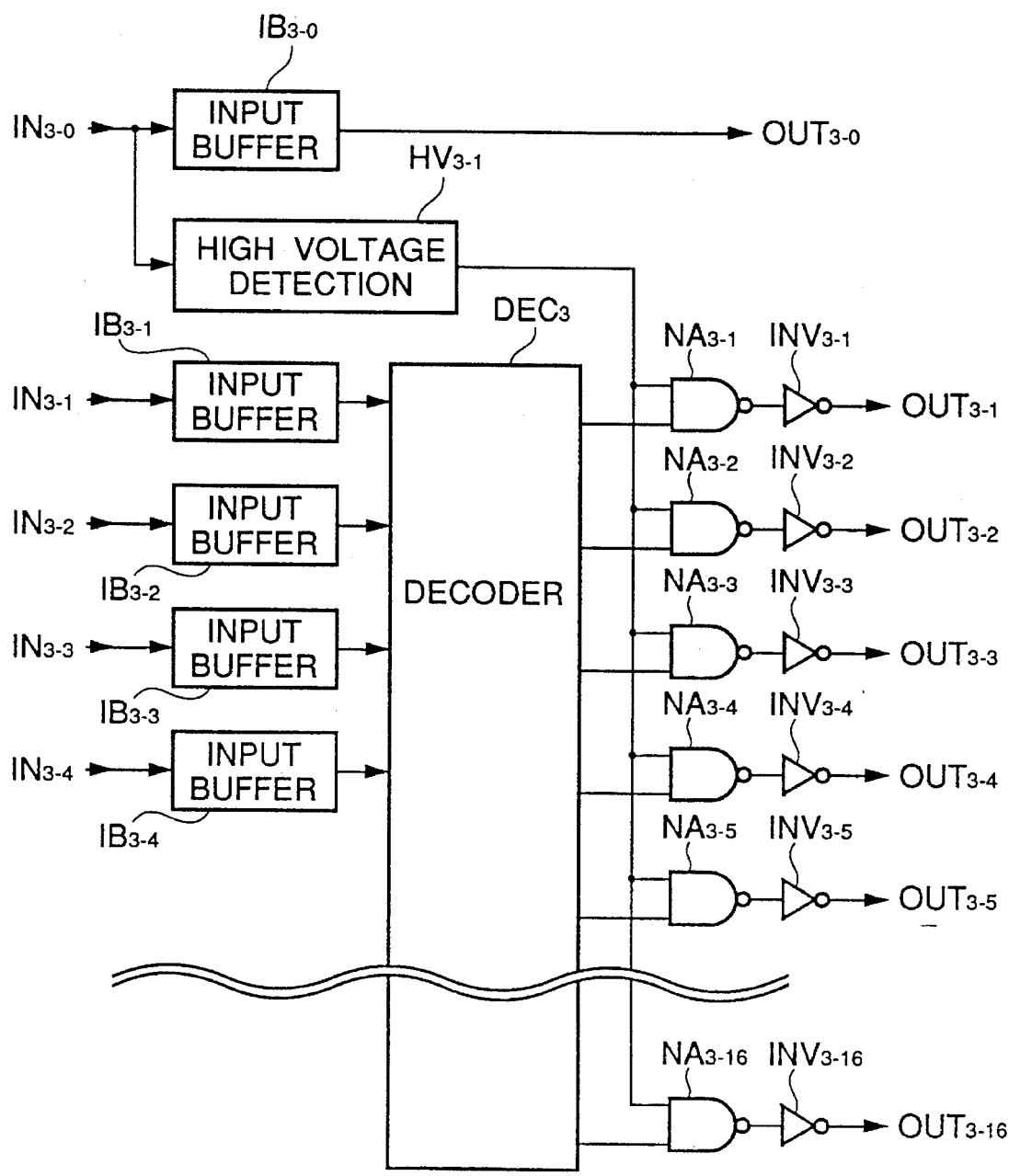
FIG. 1 is a block diagram of one example of the conventional test mode setting circuit incorporated in a semiconductor device.
Figure 2:
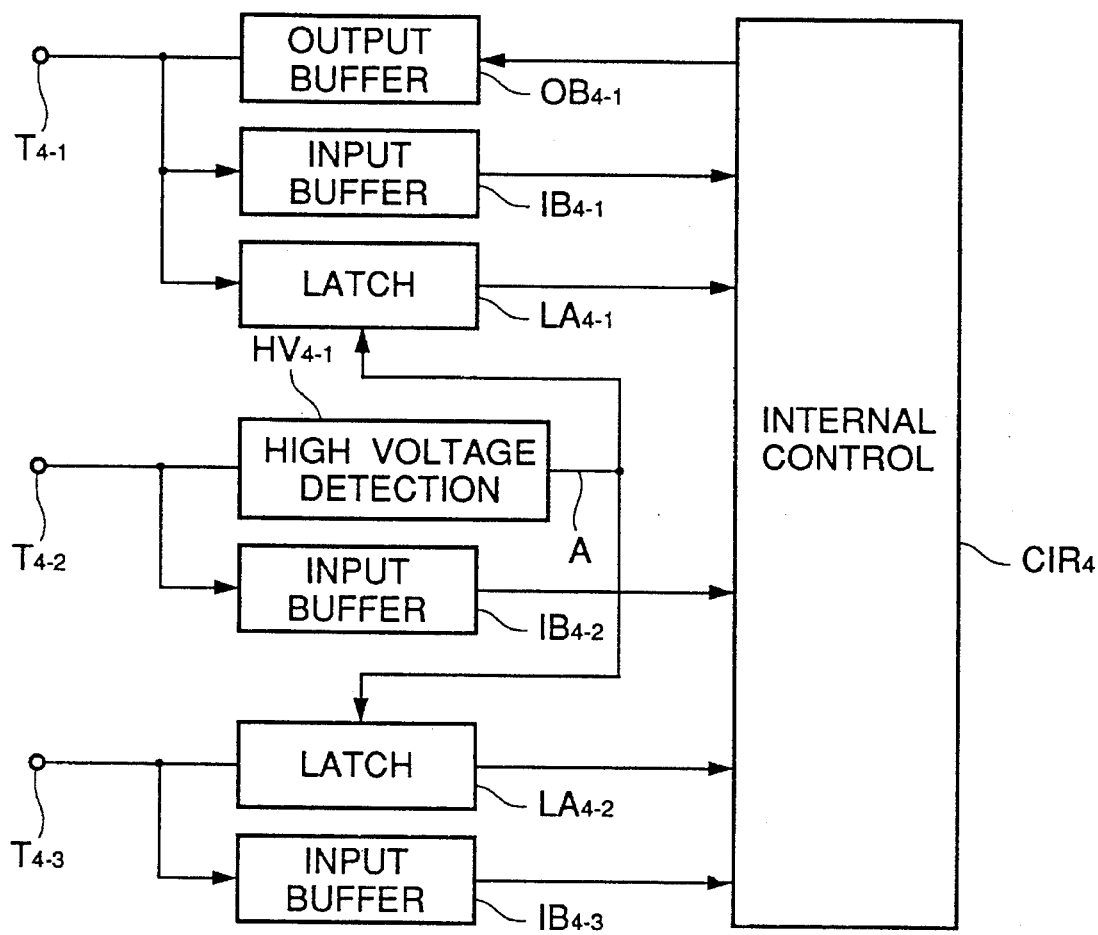
FIG. 2 is a block diagram of another example of the conventional test mode setting circuit incorporated in a semiconductor device.
Figure 3:
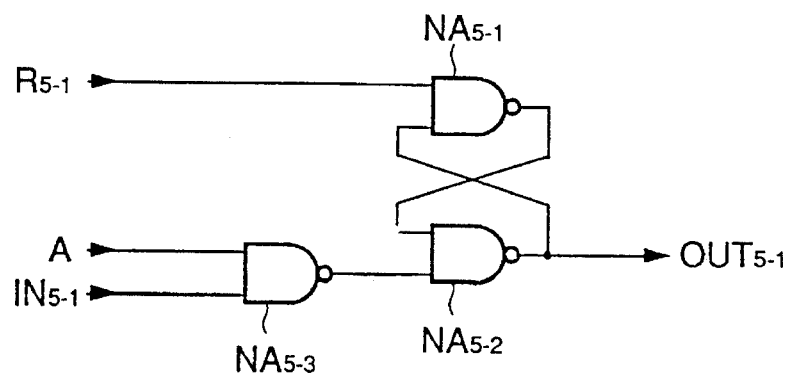
FIG. 3 is a logic circuit diagram of the latch circuit used in the test mode setting circuit shown in FIG. 2.

Each of these latch circuits is formed of one pair of NAND gates $NA_{1-1}$ and $NA_{1-2}$, $NA_{1-3}$ and $NA_{1-4}$, $NA_{1-5}$ and $NA_{1-6}$, and $NA_{1-7}$ and $NA_{1-8}$, which are connected as shown, similarly to the latch circuit shown in FIG. 3, so as to form a latch. The latch circuits $LA_{1-1}, LA_{1-2}, LA_{1-3}$ and $LA_{1-4}$ output mode setting signals $TST_{1-1}, TST_{1-2}, TST_{1-3}$ and $TST_{1-4}$, respectively.

With the above mentioned arrangement, a high voltage for setting the semiconductor device into a test mode is applied to the input terminal $IN_{1-0}$. If the high voltage is applied to the input terminal $IN_{1-0}$, the high voltage detection circuit $HV_{1-1}$ detects the high voltage and generates the output signal of the logical high level "H". In response to this inversion to the logical high level "H", the pulse generation circuit $OP_{1-1}$ generates the pulse having the predetermined pulse width.

At this time, if a signal of the logical high level "H" is applied to any one of the input terminals $IN_{1-1}, \ldots, IN_{1-4}$ (for example, $IN_{1-2}$) a corresponding one of the input buffers $IB_{1-1}, \ldots, IB_{1-4}$ (for example, $IB_{1-2}$) outputs a signal of the logical high level "H". When the output of the pulse generation circuit $OP_{1-1}$ is at the logical high level "H", if any one of the input terminals $IN_{1-1}, \ldots, IN_{1-4}$ (for example, $IN_{1-2}$) is at the logical high level "H", the logical high level "H" is latched in a corresponding one of the latch circuits (for example, $LA_{1-2}$). As a result, any one of the test mode setting signals $TST_{1-1}$, $TST_{1-2}$, $TST_{1-3}$ and $TST_{1-4}$, is fixed to the logical high level "H", so that a test mode corresponding to the input information is set.

With this, the test is performed. At this time, if the input signals supplied to the input terminals $IN_{1-1}, \ldots, IN_{1-4}$ are changed in level, corresponding signals $OUT_{1-1}, \ldots, OUT_{1-4}$ are supplied from the input buffers $IB_{1-1}, \ldots, IB_{1-4}$, respectively, so that various tests can be performed.

The pulse generation circuit $OP_{1-1}$ generates the pulse only just after the high voltage is applied to the input terminal $IN_{1-0}$, and after a predetermined period of time corresponding to the pulse width of the pulse generated by the pulse generation circuit $OP_{1-1}$ has elapsed, the output of the pulse generation circuit $OP_{1-1}$ is fixed to a logical low level "L". Accordingly, after the output of the pulse generation circuit $OP_{1-1}$ is fixed to a logical low level "L", even if the input signals supplied to the input terminals $IN_{1-1}, \ldots, IN_{1-4}$ change, the test mode setting signals $TST_{1-1}$, $TST_{1-2}$, $TST_{1-3}$ and $TST_{1-4}$ never change if the high level signal continues to be supplied from the high voltage detection circuit $HV_{1-1}$. Therefore, the test mode can be maintained while ensuring the function of supplying the input signals applied to the input terminals $IN_{1-1}, \ldots, IN_{1-4}$, as the output signal $OUT_{1-1}, \ldots, OUT_{1-4}$. Furthermore, since only one high voltage detection circuit is sufficient, the chip size never becomes large.

In order to release the test mode, it is sufficient if the high voltage applied to the input terminal $IN_{1-0}$ is cancelled. As the result of the cancellation of the high voltage, the output of the high voltage detection circuit $HV_{1-1}$ is fixed to the logical low level "L", so that each of the latch circuits is reset. Accordingly, after shipment of the semiconductor device, even if the semiconductor device assembled on a board is temporarily put into the test mode due to noise or the like, when the noise disappears, the test mode is released, so that the device resumes its normal operation.

Figure 5:
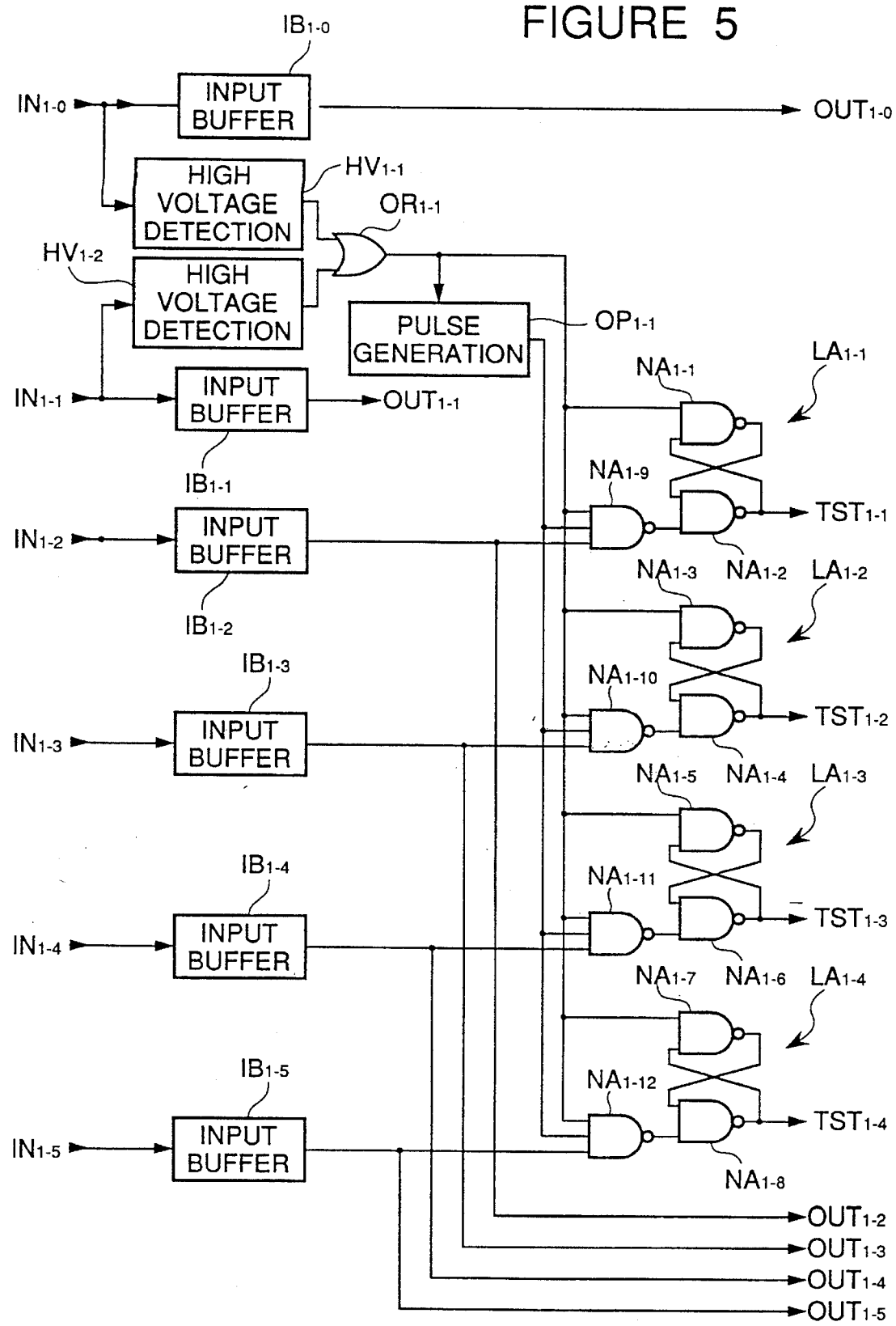
FIG. 5 is a block diagram of a second embodiment of the test mode setting circuit in accordance with the present invention, incorporated in a semiconductor device.

Referring to FIG. 5, them is shown a block diagram of a second embodiment of the test mode setting circuit in accordance with the present invention, incorporated in a semiconductor device. In FIG. 5, elements similar to those shown in FIG. 4 are given the same Reference Numerals, and explanation thereof will be omitted.

As seen from comparison between FIGS. 4 and 5, the second embodiment is different from the first embodiment in that, the two input terminals $IN_{1-0}$ and $IN_{1-1}$ are used as an input terminal for receiving the high voltage, and two high voltage detection circuits $HV_{1-1}$ and $HV_{1-2}$ are connected to the input terminals $IN_{1-0}$ and $IN_{1-1}$, respectively, and both of the outputs of the high voltage detection circuits $HV_{1-1}$ and $HV_{1-2}$ are supplied through an OR circuit $OR_{1-1}$ to the pulse generation circuit $OP_{1-1}$ and the latch circuits $LA_{1-1}, \ldots, LA_{1-4}$ and the NAND circuits $NA_{1-9}, \ldots, NA_{1-12}$.

In this second embodiment, the test mode can be set by applying the high voltage either to the input terminal $IN_{1-0}$ or the input terminal $IN_{1-1}$. Accordingly, the second embodiment can increase a variation of the input terminals which can be used in the test mode.

In the above mentioned first and second embodiments, the five input terminals and the six input terminals are provided, respectively. However, the present invention is not limited to these numbers of the input terminals. In the present invention, a mode switching instruction (the high voltage in the first and second embodiments) for switching to the test mode is applied to a predetermined input terminal ($IN_{1-0}$ in the first embodiment, and $IN_{1-0}$ and $IN_{1-1}$ in the second embodiment) of "N" input terminals (where "N" is an integer larger than 1), and mode setting information applied to other input terminals ($IN_{1-1}$ to $IN_{1-4}$ in the first embodiment, and $IN_{1-2}$ to $IN_{1-5}$ in the second embodiment) during a predetermined period of time from application of the mode switching instruction are latched and held during a period in which the mode switching instruction continues to be applied. Therefore, the present invention is in no way limited in the number of the input terminals. In the second embodiment, the mode setting information is held after the mode switching instruction is applied to either the input terminal $IN_{1-0}$ or the input terminal $IN_{1-1}$.

In addition, since the mode setting information is held in the latch circuits each constituted of a pair of NAND circuits, it is not necessary to continue to supply the mode setting information. Therefore, it is possible to carry out the test which needs to change the level of the input signals applied to the respective input terminals. In addition, the semiconductor device is never fixed to the test mode due to power supply voltage noise and the like.

The case of setting the test mode has been described. However, the present invention is not limited to the setting of the test mode, but can be applied to a case of switching different operation modes in the semiconductor device.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device comprising:

"N" input terminals (where "N" is an integer larger than 1), a mode switching instruction, which has a voltage higher than a power supply voltage, being applied to a first input terminal of said "N" input terminals, and holding means, connected to a second input terminal of said "N" input terminals, for holding a mode setting information supplied to said second input terminal during a predetermined period of time starting from application of said mode switching instruction to said first input terminal, said mode setting information being held by said holding means during a period of time in which said mode switching instruction continues to be supplied to said first input terminal and such that a test is performed based on said mode setting information held in said holding means and data applied to said "N" input terminals, wherein said holding means includes:

a one-shot circuit for generating a pulse during said predetermined period of time starting when said mode switching instruction is applied to said first input terminal, and a hold circuit for holding said mode setting information supplied to said second input terminal during said predetermined period of time, and wherein said one-shot circuit includes:

a detection circuit, connected to "M" input terminals (where "M" is an integer larger than 1, but M<N) of said "N" input terminals, for detecting that said mode switching instruction is applied to any one of said "M" input terminals, and a pulse generation circuit, connected to said deletion circuit, for generating, based on a detection result, said pulse having a pulse width corresponding to said predetermined period of time.

2. A semiconductor device according to claim 1, wherein said detection circuit comprises a plurality of predetermined voltage detection circuits, and an OR circuit for receiving an output of said plurality of predetermined voltage detection circuits and for issuing the detection result to said pulse generation circuit.

3. A semiconductor device according to claim 2, wherein said plurality of predetermined voltage detection circuits are provided in a number corresponding to a number of said "M" input terminals.

* * * * *